United States Patent [19]

Hochstein et al.

[11] Patent Number: 4,500,795
[45] Date of Patent: Feb. 19, 1985

[54] ELECTRICAL TIMING CONTROL SWITCH

[76] Inventors: Peter A. Hochstein, 14020 Fifteen Mile Rd., Sterling Heights, Mich. 48077; Kelvin Shih, 908 Devonshire Rd., Brighton, Mich. 48116

[21] Appl. No.: 430,832

[22] Filed: Sep. 30, 1982

[51] Int. Cl.³ .......................................... H05B 37/02
[52] U.S. Cl. .................. 307/141; 315/360; 323/323
[58] Field of Search .......... 307/141, 141.4, 157; 315/360; 323/323, 325

[56] References Cited

U.S. PATENT DOCUMENTS 3,939,361  2/1976  Aidala et al. .................. 307/141
4,338,562  7/1982  Terwilliger .................... 307/141 X

*Primary Examiner*—A. D. Pellinen
*Assistant Examiner*—Todd E. DeBoer
*Attorney, Agent, or Firm*—Harold W. Milton, Jr.

[57] ABSTRACT

An electrical timing circuit for controlling the activation and deactivation of an electrical load by setting a predetermined time period for which the load will be on and for providing one or more short warning periods wherein the load is deactivated prior to the expiration of the predetermined time period. The invention may be used as a switch for a light whereby the light may be actuated to remain on for an hour, but just prior to the expiration of hour period the light will momentarily go off for one or more warning periods prior to the light being turned completely off so that the switch may be reactuated to start another timing period. Momentary switches (12) control a set-reset circuit (16) which sends a signal to a NAND gate (18). A timing circuit (20) is responsive to the momentary switches (12) to provide a plurality of time spaced-signals. A first gate means (22) responds to the timing circuit (20) to provide an input to the summing gate (18) to effectively turn the load off, but only for short warning periods. A second gate means (24) is responsive to both the first gate means (22) and the timing circuit (20) to provide an input to the set-reset circuit (16) to effectively turn the load off at the end of the predetermined period.

7 Claims, 3 Drawing Figures

4,500,795

ELECTRICAL TIMING CONTROL SWITCH

TECHNICAL FIELD

The subject invention relates to an electrical switch of the type for controlling the activation and deactivation of an electrical load. Although not limited thereto, the subject invention has particular utility for use as a wall switch in a dwelling or office building for controlling lights and electrical wall outlets.

BACKGROUND ART

The steadily increasing cost of electrical power predicates a greater attention to conservation and cost reduction in the operation of electrical appliances in industrial, commercial and residential sectors. There are many instances when electrical loads are left on to consume energy without there being a necessity for the loads being on. A typical example is when an individual enters a room in a residence, turns on the lights, spends a short time in the room and leaves without turning off the lights. Another example is in a commercial office building when users of offices and cleaning people leave the offices for the night with the lights remaining on.

Timers for electrical power control have been available but have tended to be mechanical devices with movable contacts, springs with encasements or pneumatic timing mechanisms. More recent timers for appliance and lamp control are either fully electronic, where timing and switching functions are handled by solid state devices or have electronic timing circuits which control an electromechanical power switching relay or contactor. Timers which are generally available are objectionable because of the noise that the timing and switching mechanism produces and, further, because of the cumbersome resetting required to keep the load activated for an extended period while still maintaining the automatic turn-off feature. Another disadvantage of available light timers is not generally appreciated: When used to control the main lights in spaces which would normally be dark without electrical light such as basements, attics, storerooms or other enclosed areas, a potential serious safety harzard is created. The control switch is normally remotely located—at the head of a stairway or adjacent to an entrance door—and immediate access to the timing switch is usually restricted. If the timer control times out before the occupant is ready to leave the illuminated area, and little or no auxillary lighting is available, the sudden onset of darkness could present a safety hazard. Even if ambient light is available, the inability to become darkadapted in a short period of time to the sudden loss of illumination constitutes a hazard and impairs mobility. By way of example, a light timer is ideal for turning off residential basement lights after the area is no longer occupied; however, the risk of losing illumination at an inappropriate time, such as when climbing stairs, etc., poses an unacceptable risk to the user.

STATEMENT OF INVENTION AND ADVANTAGES

An assembly and method of controlling the activation and and deactivation of an electrical load with a timing circuit including a manually operable on-off control means and switch means having an on-state for placing the load in an activated mode and an off-state for placing the the load in a deactivated mode. The invention is characterized by circuit means responsive to the operation of the control means for placing the switch means in the on-state a predetermined time period and in the off-state upon the expiration of the predetermined time period and for momentarily placing the switch means in the off-state for a warning time period prior to the expiration of the predetermined time period so that momentary deactivation of the load indicates impending expiration of the predetermined time period and for re-initiating the predetermined time period in response to operation of the control means at any time including during any predetermined time period.

The main advantage of the subject invention is that the activation of the load itself is momentarily interrupted for a warning period prior to the end of the time cycle. When used with a light, the light would momentarily go out one or more times prior to the termination of the predetermined selected time period whereby the user may recycle or retrigger the circuit to effect another complete timing cycle.

FIGURES IN THE DRAWINGS

Other advantages of the present invention will be readily appreciated as the same becomes better understood by reference to the following detailed description when considered in connection with the accompanying drawings wherein.

DESCRIPTION OF THE PREFERRED EMBODIMENTS

Figure 1:
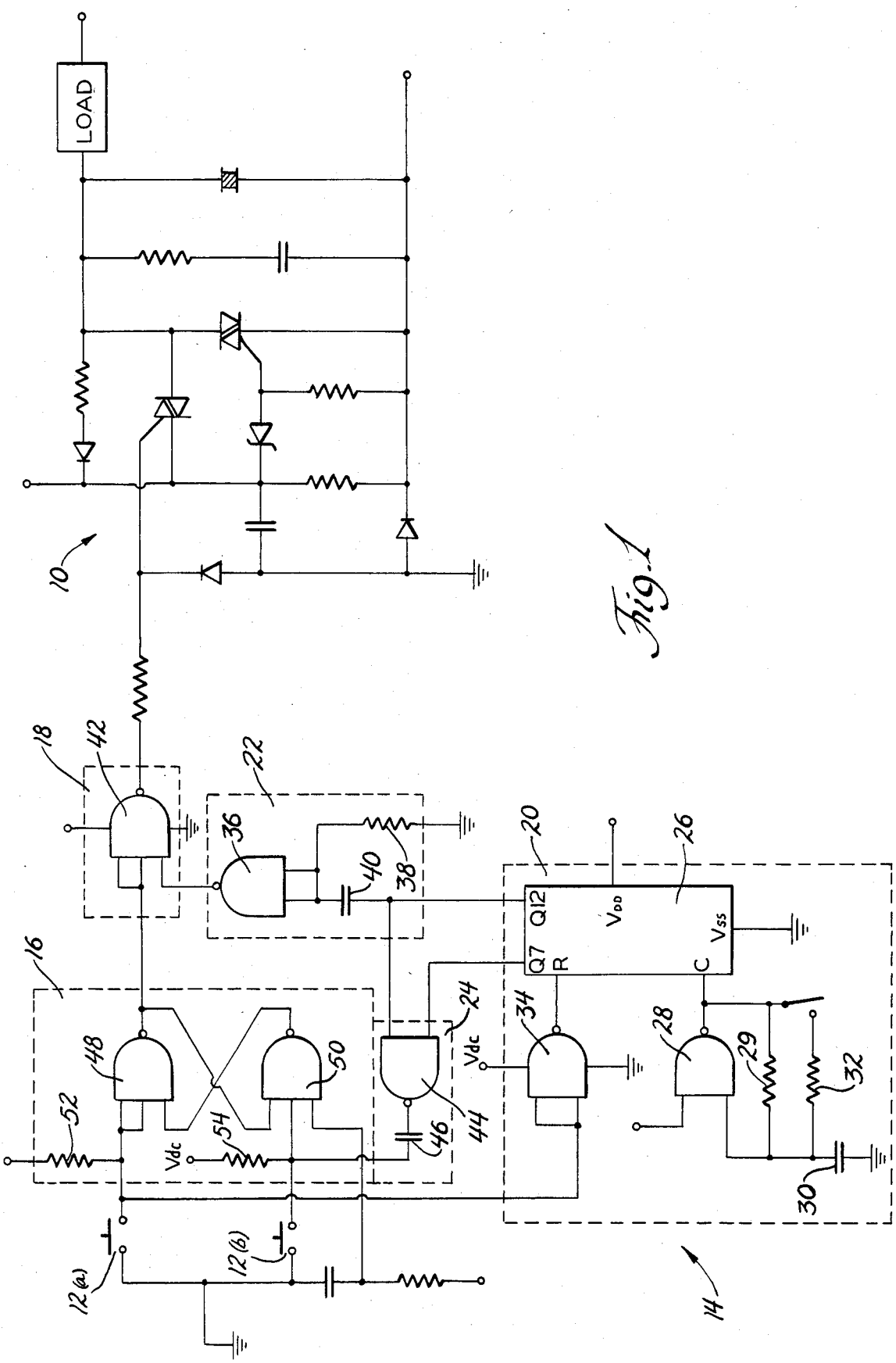
FIG. 1 is a circuit illustrating a first embodiment of the subject invention.

An electrical timing circuit for controlling the activation and deactivation of an electrical load is shown in FIG. 1. The circuit of FIG. 1 is illustrated by way of the block diagram in FIG. 3 wherein a load is shown supplied by alternating current from a power source such as an electrical plug. It will be appreciated, of course, that the electrical plug may be replaced by direct attachment of the power leads to an alternating current power source. The circuit includes a static switch means 10 having an on-state for placing the load in an activated mode and an off-state for placing the load in a deactivated mode. Also included in the switch means 10 is a direct current power supply means for supplying direct current from the alternating current power supply for the load.

The circuit also includes manually operable on-off control means 12 which includes the momentary push buttons defining "on" switch 12(a) and "off" switch 12(b), which may be a single momentary push button switch 12 as described hereinafter.

Also included is a circuit means generally indicated or shown at 14. The circuit means 14 is responsive to operation of the control means 12 for placing the switch means 10 in the on-state a predetermined time period and in the off-state upon the expiration of the predetermined time period and for momentarily placing the switch means 10 in the off-state for a warning time period prior to the expiration of the predetermined time period, all automatically. Thus, momentary deactivation of the load indicates impending expiration of the predetermined time period, i.e., momentary load deactivation provides an alarm that the load will be deactivated. Further, the predetermined time period may be re-initiated in response to operation of the control means 12 at any time including during any predetermined time period. In other words, initial operation of the control means or switches 12 sets the circuit to establish a predetermined time period or cycle during which the load will be activated but prior to which the load will be deactivated momentarily for a short warning period while at the same time further manipulation or operation of the switch control means 12 will reinitiate the predetermined time period, i.e., recycle the circuit.

Figure 3:
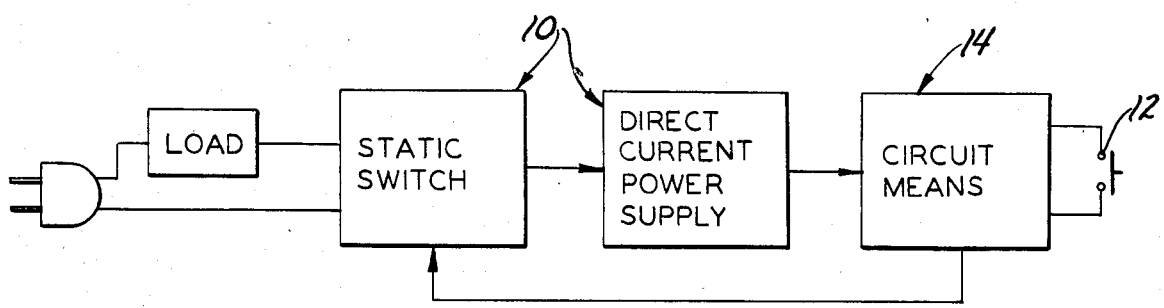
FIG. 3 is a schematic view illustrating the subject invention associated with a load.

As commonly used in electrical appliance control, switches are placed in series with the load and the hot line or source of alternating current. The neutral or return line is then connected directly to the load as shown in FIG. 3. When the switch is closed (allowing current to flow through the load) no power is available across the shorted switch to power ancillary circuits. Consequently, in order to supply d.c. operating power to circuit means 14 and to provide a static switch for controlling current flow to the load, the static switch and direct current power supply circuit means 10 is provided. When the switch is open, an alternating voltage, at low current, is available across the switch to power the d.c. supply portion of the static switch and direct current power supply means 10. The circuit 10 includes a phase angle fired triac static switch which is well-known, and has been used in other environments. It will be appreciated that other circuits of similar function may be utilized as a static switch and d.c. power supply means 10.

Referring to FIG. 1, the circuit means 14 includes a signaling circuit 16 and 18 responsive to the operation of the switch control means 12 and having on and off modes for respectively placing the switch means 10 in the on-state when in the on mode and for placing the switch means 10 in the off-state when in the off mode.

The circuit means 14 also includes a timing circuit 20 responsive to operation of the switch control means 12 for providing a plurality of time-spaced signals to establish the predetermined and warning time periods respectively.

Further, the circuit means 14 includes a transfer circuit 22 and 24 for transferring the signaling circuit to the off mode during the warning time period and at the expiration of the predetermined time period in response to the time-spaced signals generated by the timing circuit 20.

The signaling circuit includes a set-reset circuit 16 responsive to multiple input signals, including those from the switch control means 12 and from the transfer circuit for alternatively establishing on and off output signals. The signaling circuit further includes a NAND means 18 having multiple inputs including the on and off signals from the set-reset circuit 16 and inputs from the transfer circuit for establishing the on and off modes to the switch means 10 in response to respective combinations of the inputs thereto.

The transfer circuit includes a first gate means 22 responsive to at least one of the time-spaced signals of the timing circuit 20 to provide one of the inputs to the NAND means 18 to place the NAND means 18 in the off mode for the warning time period. The transfer circuit further includes a second gate means 24 responsive to the first gate means 22 and at least one of the time-spaced signals of the timing circuit 20 to provide at least one of the input signals to the set-reset circuit 16 to establish the off output of the set-reset circuit 16 at the expiration of the predetermined period.

The timing circuit 20 includes a binary counter 26 and a NAND gate 28 connected as a free-running square wave oscillator and a resistor 29/capacitor 30 circuit to establish the period of the oscillator 26.

A resistor 32 may be placed in parallel through a switch with the resistor 29 to increase the frequency of the clock generator or oscillator 26 so that the circuit may be functionally tested in a short period of time. The closing of the test switch to include the resistor 32 shortens the complete timing cycle or the predetermined time period for operational testing of the circuit. For such testing prior to shipment, the testing switch may be eliminated and the resistor 32 placed in parallel with the resistor 29 in a text fixture.

The timing circuit 20 also includes a NAND gate 34 through which a starting or reset signal is sent to the binary counter 26 upon depressing the on-switch 12(a). Actually the gate 34 acts as an inverter.

The first gate means 22 includes a NAND gate 36 in combination with a resistor 38/capacitor 40 circuit. The NAND means 18 comprises a NAND gate 42 having three inputs. The second gate means 24 comprises a NAND gate 44 connected through a capacitor 46 to the set-reset circuit 16.

The set-reset circuit 16 includes a pair of three input NAND gates 48 and 50 cross-connected to define a bistable latch establishing the on and off output signals in response to momentary input pulses from the on and off switches 12(a) and (b) and in response to the gate 44.

When the system is in the off mode so that the load is in the deactivated mode, i.e., not being powered, the output of the gate 42 defining the NAND means 18 is high and must go low to activate the switch 10 for applying power to or activating the load. Upon momentary depression of the on button 12(a), a signal is applied through the inverting gate 34 to switch the output thereof from normally low to high, thereby providing a reset signal to the reset pin of the binary counter 26 which starts the counter 26 counting from zero. Two inputs of gate 48 are connected to d.c. power through a resistor 52 and one input to gate 50 is connected to the d.c. power source through a resistor 54. The output of gate 50 is normally high in the static state and is fed to one of the three multiple inputs of gate 48 with the other two inputs to gate 48 connected to the power source through the resistor 52 so as to also be high, placing the output of gate 48 as normally low. Upon depression of the on-switch 12(a), the gate 48 is grounded changing the first two inputs thereof to low to change the output of gate 48 to high which is sent to the two inputs of the NAND gate 42 along with a normally high input from the first gate 36 thereby changing the output of gate 42 from high to low to accomplish the activation mode or "turn on" of the load. The high output of gate 48 is also one of the inputs to gate 50 along with the other two normally high inputs which, in turn, changes the normally high output of gate 50 to a low output fed into one of the inputs of gate 48 maintaining the output of the gate 48 high when the momentary on-switch 12(a) is released.

In a preferred embodiment, the outputs from the binary counter 26 are taken at the 2 to the 7th power and 2 to the 12 power counts. When 2048 (2 to the 12th) counts are reached, the positive going transition at the output of the counter 26 to the capacitor 40 and gate 36 switches the output of gate 36 from normally high to low which is transmitted as a low input to gate 42 which changes the output of the gate 42 from low back to high, i.e., the "off" state. The capacitor 40 and the resistor 38 establishes a time period for which the output of gate 36 is changed to low which is a warning time period of approximately one-half to one second; after which the output of gate 36 returns to normally high providing the high input to gate 48 which then switches its output back to low for placing the load in the activated mode.

The counter 26 stages are negative edge triggered by each input clock pulse so that when the 2 to the 12th output goes high (and stays high for another 2048 count period) all other outputs of the counter 26 go low. The counter 26 keeps accumulating counts until the 2 to the 7th output pin changes state; at this time (2 to the 12th plus 2 to the 7th counts) gate 44 senses that both the 2 to the 12th and 2 to the 7th outputs are high changing the output of the gate 44 from normally high to low which is a low input into the gate 50 causing the output thereof to switch back to normally high. The high output of gate 50 is fed to the gate 48 causing its output to return to the normally low output which when transmitted to the gate 42 changes the output of the gate 42 back to the normally high state, thereby placing the load in the deactivated mode.

This invention permits the use of a simple, low-cost twelve-stage binary counter 26 to produce the desired momentary warning signal at 2048 counts, then turn off the alternating current power at 2048 counts plus 2 to the nth power counts (n may be up to 11). In the preferred embodiment, the warning period wherein the load is deactivated occurs approximately one hour from the time the counter is started or reset while the termination of the predetermined period or total deactivation of the load occurs about two minutes later (or by using the n equals 8 output, about four minutes after the warning period). The length of the period over which one or more warning periods occur is simply chosen to offer a convenient length of time to reset the timing circuit for another integral timing interval or cycle. Of course, the timer control circuit may be turned off manually by pushing the off button 12(b) which resets the latch circuit 16 so that the output of the gate 48 remains normally low.

Figure 2:
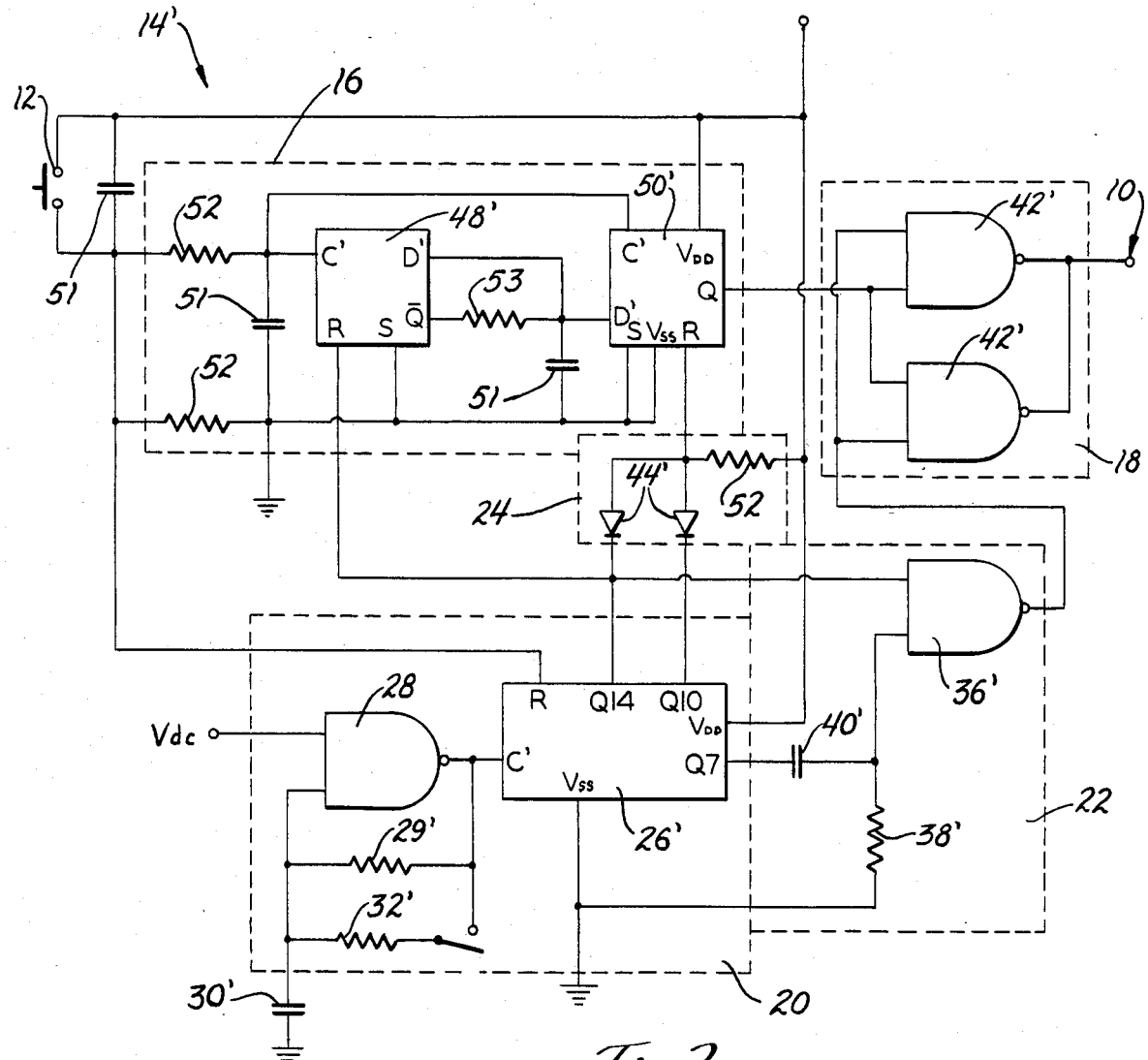
FIG. 2 is a second embodiment of a circuit means which may be utilized for establishing the timing functions of the subject invention.

An alternative embodiment of the circuit means is generally shown at 14' in FIG. 2, wherein line numerals indicate like or corresponding components to those previously described. The circuit 14' includes an set-reset circuit 16, a NAND means 18, the timing circuit 20, a first gate means 22 and a second gate means 24; however, the specific components differ slightly from those illustrated in FIG. 1.

In the first instance, the embodiment illustrated in FIG. 2 includes only one momentary push-button switch 12.

The counter circuit 26' is very similar to that shown in FIG. 1 except that a fourteen-stage binary counter 26' is used instead of the twelve-stage counter 26 shown in FIG. 1, thereby yielding somewhat greater precision since a faster time base oscillator may be used.

The set-reset circuit 16 is responsive to a single push button switch 12 and includes a pair of D-type flip-flops 48' and 50'. The NAND means 18 comprises a pair of gates 42' connected in parallel to provide sufficient drive current capacity. The first gate means 22 includes the gate 36' and the resistor 38'/capacitor 40' circuit for establishing the time constant of the warning period.

When the switch 12 is momentarily closed, the counter 26' is reset and a clock pulse is put into the flip-flops 48' and 50' whereby the logic level present at the D' input of each flip-flop 48' and 50' is transferred to the Q output for each positive going transition of the clock pulse so that the first clock pulse developed by the first closure of the switch 12 causes the Q output of the flip-flop 50' to go high and stay high, thus causing the output of gates 42' to go low to place the load in the activated mode; i.e., to turn on the static switch means 10 allowing alternating current to flow through the load. The output of the gate 36' is normally high so that only the output of flip-flop 50' is required to turn on the static switch through the gates 42'. Once reset, the counter 26' starts accumulating clock pulses generated by the free-running clock generator formed by the gate 28. When 2 to the 14th power counts have been reached, the counter resets the flip-flop 48' and enables one input of the gate 36' (the warning gate). Throughout the next time interval (2 to the 14th through 2 to the 10th) with each 2 to the 7th pulses, the output of the counter 26' through capacitor 40' generates a momentary low at the output of gate 36'—the duration of which is controlled by the resistor 38' and capacitor 40' (approximately 0.5 seconds). This momentary low from the gate 36' is reflected as an interruption of the static switch control signal, i.e., the gates 42' place the switch means in the off condition thereby deactivating the load. When sufficient additional clock pulses are counted by the counter 26' (2 to the 14th plus 2 to the 10th), both outputs thereof to the diodes 44', which are connected or wired as an AND gate, allows the reset pin R of the flip-flop 48' to go high only when both output pins from the counter 26' to the diodes 44' go high which is at the end of 2 to the 14th plus 2 to the 10th counts. When the reset pin R of the flip-flop 50' goes high, the output at Q goes low causing the parallel NAND gates 42' to the change output state from low to high, thereby turning off or placing the load in the deactivated mode.

If the control switch 12 is momentarily closed during the first timing segment (2 to the 14th counts), then the second count input to the flip-flop 50' changes the output Q to turn off the static switch because the data input is still low as it is being held that way by the flip-flop 48'. Said another way, a first closure of the switch 12 turns on the load; a second closure of switch 12 turns off the load, but only if the second closure is made within the 2 to the 14th count period. If the second closure is made after the 2 to the 14th count period, but before another 2 to the 10th counts have occurred, then the second closure resets the counter 26' for another predetermined timing period of 2 to the 14th counts thus keeping the load energized. The reason for this is that at 2 to the 14th counts flip-flop 48' is reset causing $\overline{Q}$ output to become low so that the input at C' of flip-flop 50' is disregarded for the second closure. Of course, once flip-flop 50' is reset after 2 to the 14th plus 2 to the 10th counts, the circuit is fully reset and a new predetermined time period interval or cycle may be once again initiated by a momentary closure of the switch 12.

During the timing period between 2 to the 14th counts and 2 to the 10th counts—approximately four minutes in the preferred embodiment—the load is interrupted momentarily every 2 to the 7th counts or four times before the timer shuts off the load. In other words, there are four warning periods of deactivation of the load prior to the expiration of the predetermined time period at which the load is deactivated and remains so until turned on again. During the four minute period over which the warning time periods occur, the switch 12 must be momentarily closed twice in order to turn off the load because, as stated earlier, a single closure simply resets the timer for another 2 to the 14th counts while the second closure then resets the flip-flop 50' turning off the load.

As will be appreciated, the subject invention provides a method of controlling the activation and deactivation of an electrical load comprising the steps of activating the load by supply power thereto for a predetermined time period and terminating power thereto at the expiration of the predetermined time period and deactivating the load by terminating power thereto for a momentary warning time period prior to the expiration of the predetermined time period so that the momentary deactivation of the load during the warning time period indicates impending expiration of the overall predetermined time period. This may be accomplished by processing inputs from a manually operable control means 12 in a signaling circuit 16 and 18 to establish on and off modes for respectively activating and deactivating the load and providing a plurality of time spaced signals in response to the control means 12 to establish the predetermined and warning time periods respectively and transferring the signaling circuit to the off mode during the warning time period and at the end of the expiration of the predetermined time period in response to the time-spaced signals.

The following table represents a listing of the components by reference numeral, component identification and value where applicable for the various components which may be utilized in the exemplary embodiments 14 and 14'.

COMPONENT TABLE

| Reference Nos. | Component | Value or Identification |
|---|---|---|
| 26 | Counter | CD4040B |
| 26' | Counter | CD4020B |
| 28, 34, 36, 44, 36' and 42' | CMOS Gate | CD4093 |
| 42, 48, 50 | CMOS Gate | CD4023 |
| 40 | Capacitor | 1.0 uF |
| 30 | Capacitor | 0.33 uF |
| 30', 40' | Capacitor | 0.47 uF |
| 46 | Capacitor | 0.001 uF |
| 51 | Capacitor | .01 uF |
| 29 | Resistor | 2.7M Ohms |
| 29' | Resistor | 910K Ohms |
| 32, 52, 54 | Resistor | 100K Ohms |
| 32', 53 | Resistor | 10K Ohms |
| 38, 38' | Resistor | 1M Ohm |
| 44' | Diode | 1N4148 |
| 48', 50' | Flip-flop | CD4013B |

The instant invention has been described in an illustrative manner and it is to be understood that the terminology which has been used is intended to be in the nature of words of description rather than of limitation.

Obviously, many modifications and variations of the present invention are possible in light of the above teachings. It is, therefore, to be understood that within the scope of the appended claims, wherein reference numerals are merely for convenience and are not to be in any way limiting, the invention may be practiced otherwise than as specifically described.

We claim:

1. An electrical timing circuit for controlling the activation and deactivation of an electrical load comprising: a manually operable on-off control means, switch means having an on-state for placing the load in an activated mode and an off-state for placing the load in a deactivated mode, circuit means responsive to operation of said control means for placing said switch means in said on-state a predetermined time period and in said off-state upon the expiration of said predetermined time period and for momentarily placing said switch means in said off-state for a warning time period prior to said expiration of said predetermined time period so that momentary deactivation of the load indicates impending expiration of said predetermined time period and for reinitiating said predetermined time period in response to operation of said control means, said circuit means including a signaling circuit responsive to operation of said control means and having on and off modes for placing said switch means in said on-state when in said on mode and for placing said switch means in said off-state when in said off mode, a timing circuit responsive to operation of said control means for providing a plurality of time spaced signals to establish said predetermined and warning time periods respectively, and a transfer circuit for transferring said signaling circuit to said off mode during said warning time period and at said expiration of said predetermined time period in response to said time spaced signals, said signaling circuit including a set-reset circuit responsive to input signals from said control means and said transfer circuit for alternatively establishing on and off output signals and during said predetermined time period and for reestablishing said predetermined time period upon initial operation of said control means during the period between the initiation of said warning period and the expiration of said predetermined time period.

2. A circuit as set forth in claim 1 further characterized by NAND means responsive to inputs including said on and off signals from said set-reset circuit and inputs from said transfer circuit for establishing said on and off modes to said switch means; and by said transfer circuit including first gate means responsive to at least one of said time spaced signals of said timing circuit to provide one of said inputs to said NAND means to place said NAND means in said off mode for said warning time period, and second gate means responsive to said first gate means and at least one of said time spaced signals of said timing circuit to provide at least one of said input signals to said set-reset circuit to establish said off output of said set-reset circuit at said expiration of said predetermined period.

3. A circuit as set forth in any one of claims 1 or 2 further characterized as including a direct current power supply means for supplying said circuit means with direct current from the alternating current power supply for the load.

4. A circuit as set forth in claim 2 further characterized by said timing circuit including a binary counter and a NAND gate connected as a free-running square wave oscillator and a resistor/capacitor circuit to establish the period of the oscillator; and by said first gate means including a NAND gate in combination with a resistor/capacitor circuit; and by said NAND means including at least one NAND gate.

5. A circuit as set forth in claim 4 further characterized by said control means including a momentary on switch and a momentary off switch; and by said set-reset circuit including a pair of three input NAND gates cross-connected to define a bistable latch establishing said on and off output signals in response to momentary input pulses from said on and off switches and in response to said second gate means; and by said timing circuit including an inverting gate interconnecting said on switch and said counter.

6. A circuit as set forth in claim 1 further characterized by said control means comprising a single momentary push button switch; and by said set-reset circuit including a pair of interconnected flip flops.

7. A method of controlling the actuation and deactivation of an electrical load comprising the steps of; activating the load by supplying power thereto for a predetermined time period and terminating power thereto at the expiration of said predetermined time period, deactivating the load by terminating power thereto for a momentary warning time period prior to the expiration of the predetermined time period so that momentary deactivation of the load during the warning time period indicates impending expiration of the predetermined time period, processing inputs from a manually operable control means in a signaling circuit which includes a set-reset circuit responsive to input signals from said control means to establish on and off modes for respectively activating and deactivating the load, providing a plurality of time-spaced signals in response to the control means to establish the predetermined and warning time periods respectively, transferring the signaling circuit to the off mode during the warning time period and the expiration of the predetermined time period in response to the time-spaced signals, and directly reestablishing the predetermined time period in the on mode without establishing the off mode in response to manual operation of the control means during the period between the initiation of the warning period and the expiration of the predetermined time period.

* * * * *